United States Patent [19]

Yokoyama

[11] 4,238,737
[45] Dec. 9, 1980

[54] BIASING ARRANGEMENT FOR A PUSH-PULL AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 929,534

[22] Filed: Jul. 31, 1978

Related U.S. Application Data

[63] Continuation of Ser. No. 564,651, Apr. 2, 1975, abandoned.

[30] Foreign Application Priority Data

| Apr. 3, 1974 | [JP] | Japan | 49/37497 |
| Apr. 4, 1974 | [JP] | Japan | 49/38162 |
| Apr. 4, 1974 | [JP] | Japan | 49/38163 |
| Apr. 6, 1974 | [JP] | Japan | 49/39231 |
| May 10, 1974 | [JP] | Japan | 49/51875 |
| May 11, 1974 | [JP] | Japan | 49/52658 |

[51] Int. Cl.³ .......................... H03F 3/45; H03F 3/30
[52] U.S. Cl. ............................. 330/255; 330/253; 330/261; 330/269; 330/297; 330/300

[58] Field of Search ............... 330/253, 255, 261, 264, 330/269, 277, 297, 300

[56] References Cited

U.S. PATENT DOCUMENTS 4,068,183  1/1978  Horinaga ............... 330/277 X

FOREIGN PATENT DOCUMENTS 1003319  9/1965  United Kingdom ............... 330/252

Primary Examiner—James B. Mullins
Attorney, Agent, or Firm—Cushman, Darby & Cushman

[57] ABSTRACT

A biasing arrangement comprising: a pair of gate biasing resistors for Field Effect Transistors forming a push-pull amplifier, and a constant-current supplying means having two output terminals for supplying stabilized gate bias voltages to the transistors. The constant-current supplying means can be adjusted manually or automatically for setting a suitable operation point of the transistors and for balancing their bias voltages. By this arrangement, amplifiers can have a simplified structure. This arrangement greatly simplifies biasing means which also can be easily regulated.

6 Claims, 11 Drawing Figures

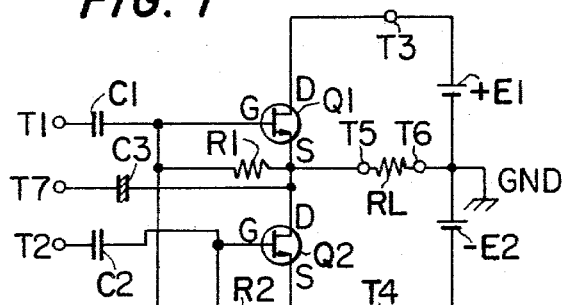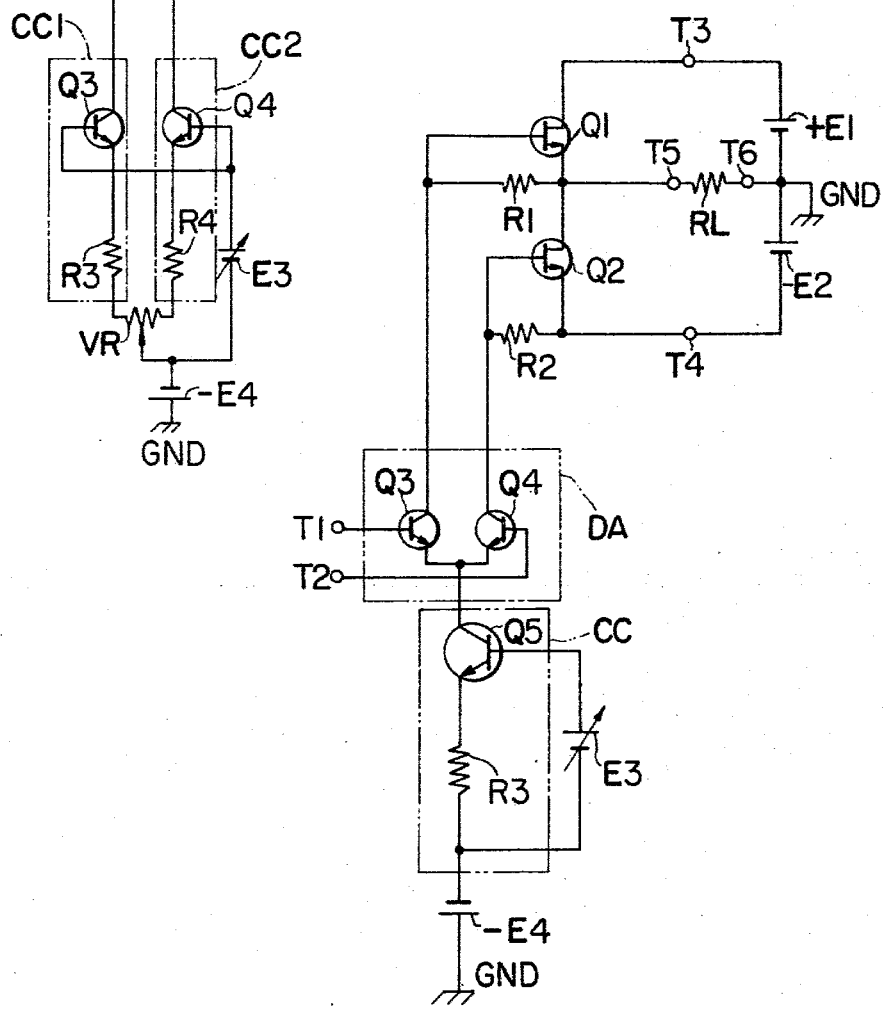

BIASING ARRANGEMENT FOR A PUSH-PULL AMPLIFIER

This is a continuation, of application Ser. No. 564,651 filed April 2, 1975 and abandoned upon the filing hereof.

BACKGROUND OF THE INVENTION (a) Field of the Invention

This invention relates to a push-pull amplifier, and more particularly to a biasing arrangement for a direct-coupled push-pull amplifier employing Field Effect Transistors.

(b) Description of the Prior Art

A conventional output transformerless (OTL) amplifier has such advantage as to need no output transformer which may cause wave distortion, unfavorable frequency characteristic, and power loss. However, most of the recent solid-state OTL amplifiers employing a single ended push-pull (SEPP) circuit need a coupling capacitor which shows a higher impedance in lower band. Therefore, these amplifiers have unfavorable frequency characteristic in lower band.

An output capacitorless (OCL) amplifier is free from the disadvantages described above.

There is a known OCL amplifier with direct-coupled stages supplied by center grounded negative and positive batteries. But, if all stages are composed of Field Effect Transistors (FET), the bias circuit would be complicated because of the batteries which must be provided independently for each amplifier stage.

SUMMARY OF THE INVENTION

Accordingly, an object of the present invention is to provide a push-pull amplifier having a simple and easily adjustable biasing arrangement.

Another object is to provide the arrangement capable of adjusting with a single operation the bias voltages for a pair of Field Effect Transistors.

A further object of the invention is to provide the arrangement capable of eliminating in balance between the bias voltage of the transistors.

Still another object is to provide a simple and easily adjustable biasing arrangement for all stages of a direct-coupled amplifier.

According to the present invention, a biasing arrangement comprises a pair of resistors and an adjustable constant-current supplying means for the resistors. The resistors are connected between the gate and the source electrodes of respective Field Effect Transistors serially connected to form a power amplifier. The constant current supplying means can be adjusted manually or automatically for setting a suitable operation point of the transistors and for balancing their bias voltages. This biasing arrangement is available for any stage of a push-pull amplifier.

A plurality of the present biasing arrangements can be used in a direct-coupled multistage amplifier.

BRIEF DESCRIPTION OF THE DRAWINGS

FIG. 1 shows a power push-pull amplifier employing an embodiment of the biasing arrangement of the present invention.

FIG. 2 shows a push-pull amplifier employing another embodiment of this invention.

DETAILED DESCRIPTION OF THE PREFERRED EMBODIMENTS

Figure 3:
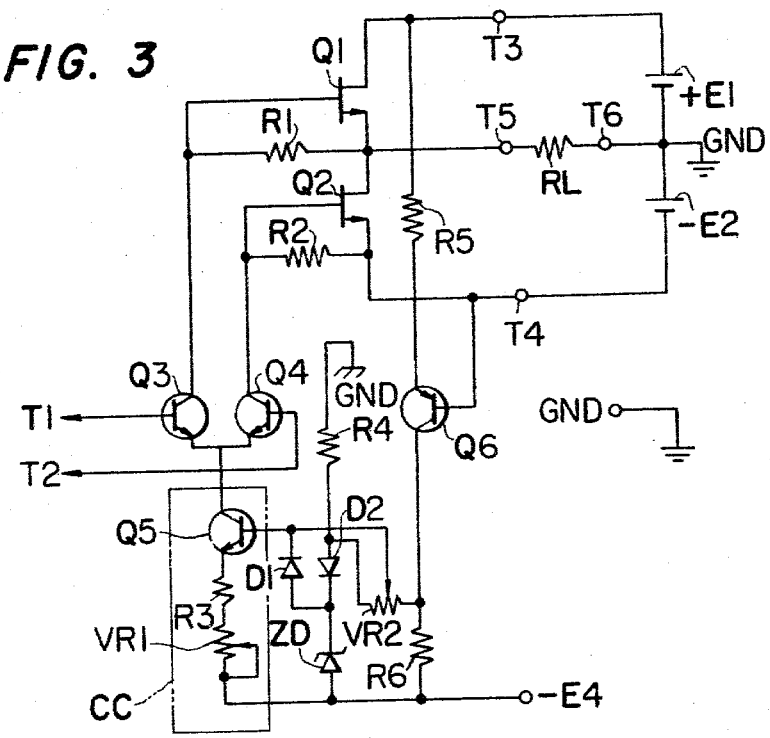
FIGS. 3 to 6 show push-pull amplifiers employing other embodiments of the biasing arrangements.

For full understanding of the nature and objects of the invention reference should be had to the following detailed description taken in connection with the accompanying drawings wherein; FIG. 1 shows a power push-pull amplifier utilizing a biasing arrangement of this invention. This amplifier circuit comprises a pair of Field Effect Transistors Q1 and Q2 connected in series. The gate of Q1 is coupled through capacitor C1 to the input terminal T1, and the gate of Q2 is coupled through capacitor C2 to the input terminal T2. The source of Q1 is connected with positive terminal T3 of serially connected batteries +E1 and −E2, and the drain of transistor Q2 is connected with negative terminal T4 of the batteries. Between the gate and the source electrodes of the transistors are connected respectively resistors R1 and R2. The terminal T5 is connected to the point where the source electrode of transistor Q1 is connected with the drain of transistor Q2. The terminal T6 is connected to the point where the two batteries +E1 and −E2 are connected each other. A load (or a loud speaker) RL is connected directly between terminals T5 and T6, and terminal T6 is grounded. Furthermore, the gates of transistors Q1 and Q2 are connected respectively to the collectors of transistors Q3 and Q4. The emitter of transistor Q3 is connected through resistor R3 to an end of variable resistor VR, and the emitter of transistor Q4 is connected through resistor R4 to the other end of the resistor VR. The sliding tap of the resistor VR is connected to battery −E4. The base electrodes of transistors Q3 and Q4 are connected together through variable voltage supply E3 to battery −E4. The transistor Q3 and resistor R3 form a constant-current supplying unit CC1, and transistor Q4 and resistor R4 another constant-current supplying unit CC2.

The gate-source bias voltages of transistors Q1 and Q2 are given by the voltage drop over respective resistors R1 and R2. The gates of these transistors are biased at a lower potential than that of the respective source electrodes. Thus, the transistors are normally biased. In this condition, a current flows through resistor R1, unit CC1, and resistor VR into battery −E4, and another current flows through resistor R2, unit CC2, and resistor VR into the battery −E4. Therefore, a tap adjustment in resistor VR will balance the gate-source bias voltages of transistors Q1 and Q2, because the adjusted resistor VR provides the same amount of voltage drops at resistors R1 and R2 to permit transistors Q3 and Q4 to carry the same amount of current. Variable voltage supply E3 is provided to change the amount of currents flowing respectively from batteries +E1 and −E2 through resistors R1 and R2 to transistors Q3 and Q4 in order to equally vary, by a single adjustment, the gate-source bias voltages of transistors Q1 and Q2. Therefore, operation mode is selectively set either at class A or class B.

In this circuit configuration, transistors Q3 and Q4, forming respectively constant-current supplying units CC1 and CC2, are inserted parallel to Field Effect Transistors Q1 and Q2. Therefore, the transistors Q1 and Q2, although having substantially infinite gate impedances, are affected by the transistors Q3 and Q4. To eliminate this inconvenience, transistors Q3 and Q4 should have infinite impedance for alternating current, and therefore they should be Field Effect Transistors or bi-polar transistors which have the same characteristic as that of pentodes. When employing that type of transistors, transistor Q3 and Q4 show a high impedance for alternating current at their collector sides, and hence they can be ignored in a-c operation. Only direct currents are supplied to resistors R1 and R2.

AC operation of this amplifier circuit is the same as conventional push-pull amplifiers. An input signal is applied to terminals T1 and T2 with phases opposite to each other.

According to the present biasing arrangement, bias voltages of Field Effect Transistors can be balanced by a single adjustment, and also those bias voltages can be equally adjusted by another single adjusting operation.

Another embodiment of this biasing arrangement is shown in FIG. 2. The constant-current supplying means consists of differential amplifier DA and constant-current supplying unit CC in place of two constant-current supplying units CC1 and CC2 in the circuit of FIG. 1.

The differential amplifier comprises two transistors Q3 and Q4. The base electrodes of transistors Q3 and Q4 are connected respectively to input terminals T1 and T2. The collectors of transistors Q3 and Q4 are connected respectively to the gates of Field Effect Transistors Q1 and Q2. The base electrodes of transistors Q3 and Q4 are connected to the collector electrode of transistor Q5 in constant-current supplying unit CC. The emitter electrode of transistor Q5 is connected through resistor R3 to negative voltage supply −E4. The base electrode of transistor Q5 is connected through variable voltage supply E3 to negative voltage supply −E4.

Both currents through resistor R1 and through R2 can be equally changed by a change in base-emitter voltage of transistor Q5, or change in supply voltage E3, as far as the base potentials of transistors Q3 and Q4 remain constant.

Differential amplifier DA can be used as a driver amplifier by applying an input signal with opposite phases to input terminals T1 and T2 of the transistors Q3 and Q4. In that case, the substantial constant-current supplying unit is only one.

FIG. 3 shows a push-pull amplifier provided with another biasing arrangement. This amplifier circuit is almost the same as that of FIG. 2 except a means for detecting fluctuation in supply voltages. In the circuit, a serial connection of transistor Q6 and resistor R6 is inserted between voltage supplies +E1 and −E4, and the base electrode of transistor Q6 is connected to voltage supply E2. According to this circuit configuration, fluctuation in supply voltages is detected in form of voltage drop across the resistor R6. The detected fluctuation is fed through variable resistor VR2 connected with resistor R6 to the base of transistor Q5. Furthermore, the resistor VR2 has its other end connected to the anode of diode D2 which is connected through Zener diode ZD to battery −E4. This cathode is further connected through diode D1 to the base electrode of transistor Q5. Transistor Q5, resistor R3 and variable resistor VR1 form a constant current supplying unit CC.

The output current of current supplying unit CC is varied in response to the detected voltage, and the variation in output current compensates the bias voltage. In other words, the voltage fluctuation ($\pm \alpha V$) between the supplies +E1 and −E2 appears across resistor R5. This voltage fluctuation is converted to a current and then reconverted to a voltage fluctuation over resistor R6. In an example, the reference voltage (Zener voltage) supplied to the base of transistor Q5 is assumed to be 12 volts, and this value is equal to that of the voltage across resistor R6 appearing at the time when supply voltage +E1 and −E2 are at a rated voltage. In that condition, the ends of resistor VR2 are held at the same potential, and no potential difference appears across the resistor. Transistor Q5 carries an emitter current determined by the sum of resistances R3 and VR1. If the sliding tap of variable resistor VR2 is positioned at the left end (anode side of diode D2), the Zener voltage, or reference voltage, is fed to the base electrode of transistor Q5. Therefore, unit CC works as an ordinary constant-current supplying unit which does not compensate the fluctuation of the battery voltage. Variation in supply voltages will result in variation of the drain currents of Field Effect Transistors Q1 and Q2. A rightward shift of sliding tap (toward resistor R6) adds a portion of the voltage across resistor R6 to the base of transistor Q5, and therefore the base bias voltage of transistor Q5 is varied according to the variation of voltage across resistor R6. This means, the output current of transistor Q5 is varied in response to a change in drain supply voltage.

Figure 4:
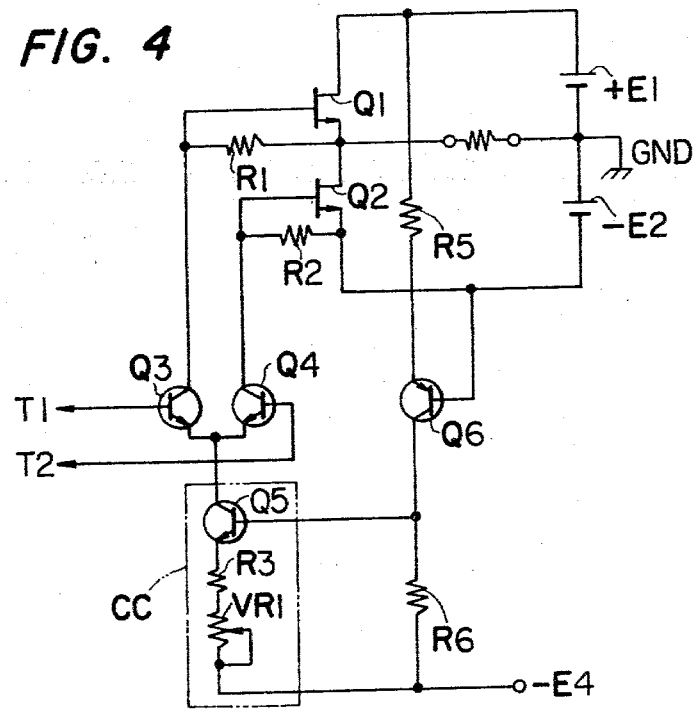
Figure 5:
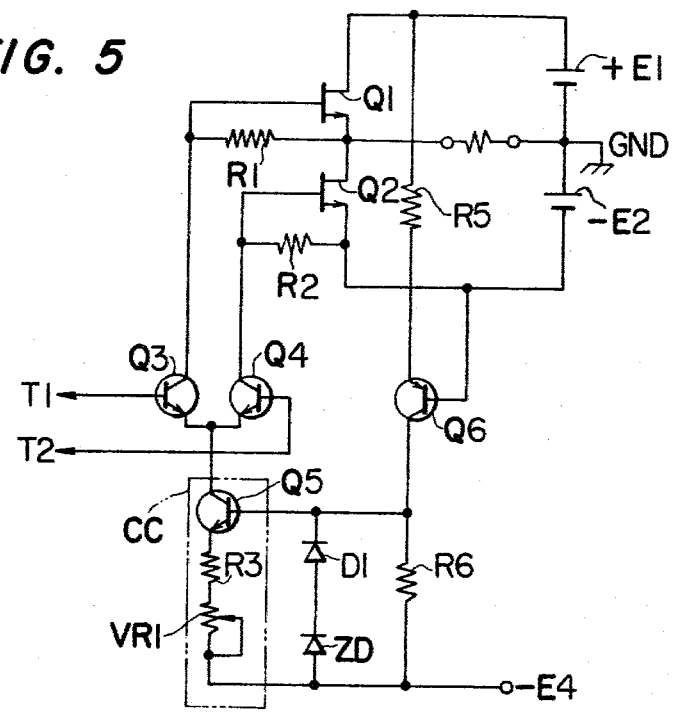

If the balance of Field Effect Transistors Q1 and Q2 is ideal, the circuits of FIGS. 4 and 5 are available.

In FIG. 4, constant current supplying unit CC does not have Zener diode ZD, resistor R4, diodes D1 and D2, and variable resistor VR2 for balance adjustment all of which are in the circuit of FIG. 3. The base electrode of transistor Q5 is connected directly to an end of resistor R6. The operation of this circuit is the same as that of the circuit in FIG. 3, when the sliding tap of variable resistor VR2 in FIG. 3 positioned at its right end.

In FIG. 5, constant-current supplying unit CC does not have diode D2, resistor R4, and variable resistor VR2 all of which are in the circuit of FIG. 3.

Operation is as follows: When the potential difference between voltage supplies +E1 and −E2 becomes higher than the rated voltage, the voltage across resistor R6 exceeds the Zener voltage, and hence diode D1 is back-biased. In this condition, the voltage across resistor R6 is fed directly to the base of transistor Q5.

When the supply voltage becomes lower than the rated voltage, diode D1 becomes conductive, and Zener voltages are applied to the base of the transistor Q5. Thus, the present circuit regulates only higher voltages than the rated voltage.

Figure 6:
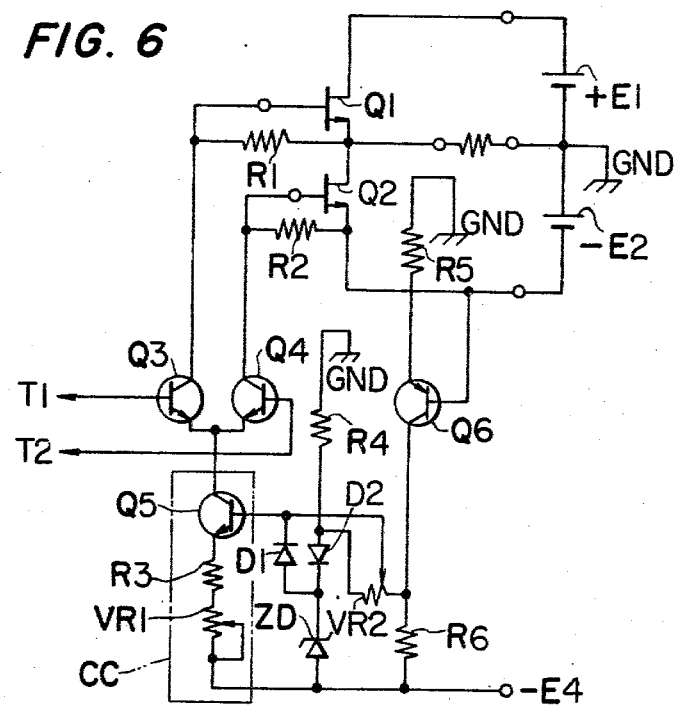

In the circuit of FIG. 3, resistor R5 may be connected to the ground GND (see FIG. 6) instead of voltage supply +E1. In that case, potential difference between the ground and one voltage supply (E2) is detected.

According to the circuits of FIGS. 3 to 6, ripple component in the supply voltages are canceled and signal distortion at the Field Effect Transistors is minimized.

Figure 7:
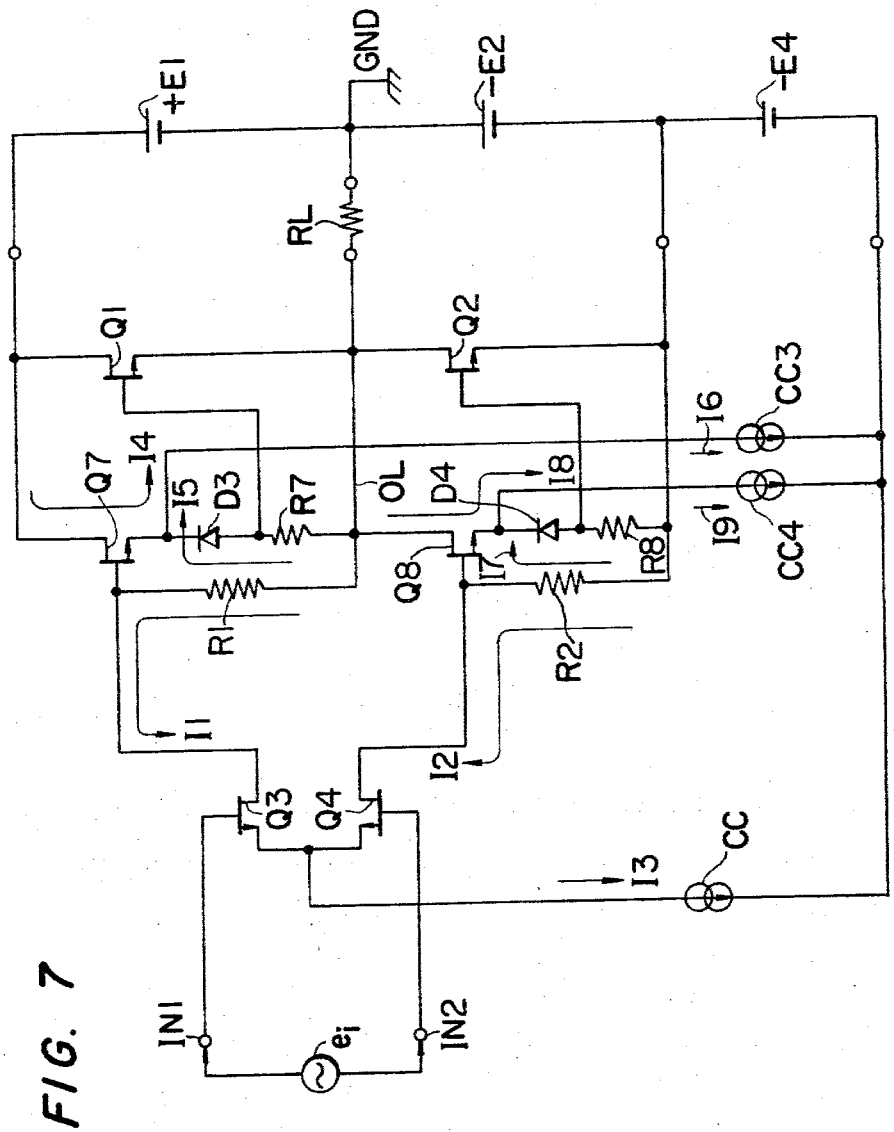
FIG. 7 shows a direct-coupled amplifier provided with the biasing arrangement of this invention.

FIG. 7 shows a direct coupled multistage amplifier provided with the biasing arrangement in accordance with the present invention. This amplifier consists of pre-, driver, and a power amplifier stage.

The preamplifier stage comprises a pair of push-pull transistors Q3 and Q4 having gates connected respectively with input terminals IN1 and IN2, source electrodes connected together through constant-current supplying unit CC to voltage supply −E4, and drain electrodes connected directly to the respective gates of Field Effect Transistors Q7 and Q8.

The source follower driver stage comprises a pair of push-pull transistors Q7 and Q8. The gates of Transistors Q7 and Q8 are connected respectively with the drains of transistors Q3 and Q4. The drain of transistor Q7 is connected to a positive voltage supply +E1. The source electrode of transistor Q7 is connected through back-biased diode D3 and resistor R7 to output line OL (neutral potential). The gate of transistor Q7 is connected through resistor R1 to output line OL. The drain of transistor Q8 is connected to output line OL. The source electrode of transistor Q8 is connected through back-biased diode D4 and resistor R8 to negative voltage supply −E2. The gate of transistor Q8 is connected through resistor R2 to negative voltage supply −E2. Resistors R1 and R2 provide respectively gate-source bias voltage VGS7 and VGS8 of transistors Q7 and Q8. The source electrodes of transistors Q7 and Q8 are connected respectively through constant current source CC3 and CC4 to negative voltage supply −E4. The junction point of diode D3 and resistor R7 is connected to the gate of transistor Q1. The junction point of diode D4 and resistor R8 is connected to the gate of transistor Q2. Diodes D3 and D4 are for protecting the gate-source voltage VGS1 and VGS2 of transistors Q1 and Q2 from overdrive.

The power amplifier stage includes Field Effect Transistors Q1 and Q2. The circuit of this stage is the same as that of FIG. 1.

AC operation of this amplifier is the same as conventional FET push-pull amplifier.

The features of this amplifier circuit are as follows:
The bias voltages increasing in the order of Pre-, driver, and power amplifier stage make possible the direct coupling of these stages.
This amplifier circuit may have a negative feedback loop which will stabilize the direct current of the amplifier.
This amplifier needs no independent bias voltage supply and therefore has a simple circuit configuration. This amplifier includes no capacitor, and hence direct coupling of all stages are possible. That means, a wide-range stable amplifier can be obtained.

Figure 8:
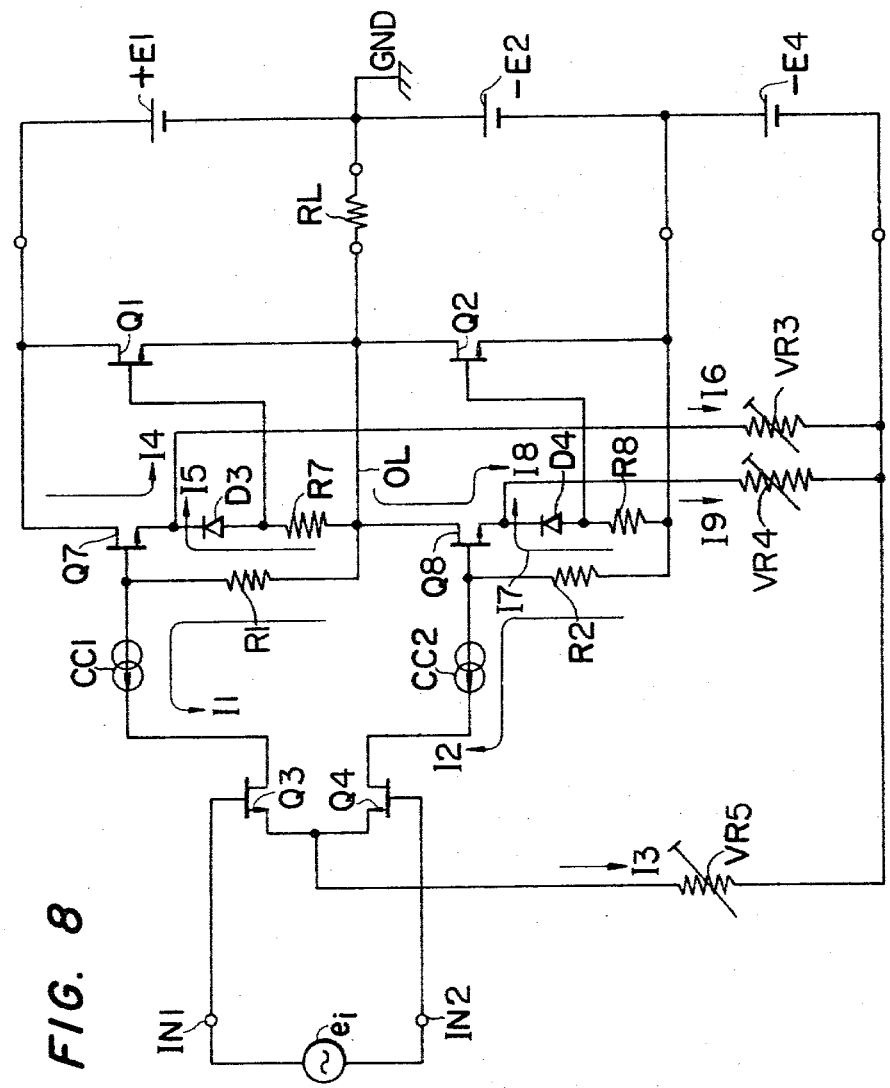
FIG. 8 shows another direct-coupled amplifier provided with the present biasing arrangement.

FIG. 8 shows another direct-coupled multistage amplifier. The circuit configuration is almost the same as that of FIG. 7. Here, said constant-current supplying units CC, CC3, and CC4 are substituted by rheostats VR5, VR3, and VR4, and a pair of constant-current supplying units CC1 and CC2 are inserted respectively between gate electrodes of transistors Q7 and Q8 and drain electrodes of transistors Q3 and Q4.

According to this circuit configuration, all currents in the circuit are adjusted by rheostats VR3 to VR5. In addition, bias voltages VGS7 and VGS8 of transistors Q7 and Q8 are extremely stable because of the constant-current supplying unit CC1 (CC2) inserted between gate electrode of transistor Q7 (Q8) and drain electrode of transistor Q3 (Q4).

AC operation of this amplifier circuit is the same as conventional FET push-pull amplifier.

Figure 9:
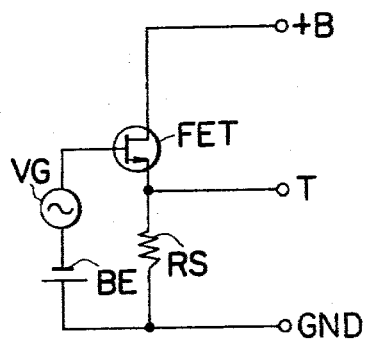
FIG. 9 shows a source follower circuit.

Other features of this amplifier circuit are the same as those of the amplifier in FIG. 7. FIG. 9 shows a conventional source follower circuit utilizing a Field Effect Transistor (FET). In this circuit, an output signal is taken out of source electrodes of FET. According to this circuit configuration, a signal on output terminal T is positive with respect to ground GND. Therefore, this terminal T cannot be connected directly to a gate electrode of an n-channel FET (of depletion type) in the next stage. If the present source follower circuit is used without any improvement, the source potential of FET in the next stage must be raised higher than the source potential of field effect transistor in the source follower circuit. This is because of the requirement that the source potential of FET in the next stage must be held higher than its gate potential. If a d-c voltage supply is used to raise the source potential, it causes power loss.

According to the present invention, the source follower circuit is improved to surmount said disadvantage, and is utilized in FIGS. 7 and 8 at the driver stage including transistors Q7 and Q8.

Figure 10:
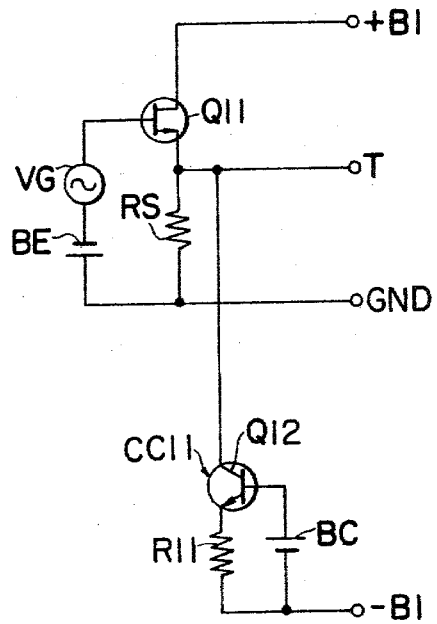
FIG. 10 shows a source follower circuit according to this invention.

FIG. 10 shows a source follower circuit in accordance with the present invention. The source electrode of transistor Q11 (corresponding to Q7 or Q8) is connected through a constant-current supplying circuit CC11 (corresponding to CC3 and CC4) consisting of transistor Q12 with emitter electrode connected through resistor R11 to negative voltage supply −B1, base electrode connected through bias voltage supply BC to said negative voltage supply −B1, and collector electrode connected to the source electrode of FET Q11. The transistor Q12 should be a field effect transistor (FET) or a bipolar transistor having characteristic of pentode.

In the circuit of the figure, a first current flows from voltage supply +B1 through transistor Q11 to the constant-current supply CC11, and a second current flows from ground GND through resistor RS (corresponding to R7 and R8) to the constant-current supply CC11. If the circuit is so designed that said first current is equal to said second current, the source potential becomes negative. That is, equivalent current flowing from voltage supply +B1 through transistor Q11 and resistor RS to ground GND is reversed in polarity across resistor RS.

The constant-current supplying circuit inserted parallel to output T hardly give any ill effect to a-c operation of this source follower circuit, when transistor Q12 has a high output impedance.

The negatively biased output terminal T is capable of being connected directly to the gate of the succeeding n-channel FET.

Figure 11:
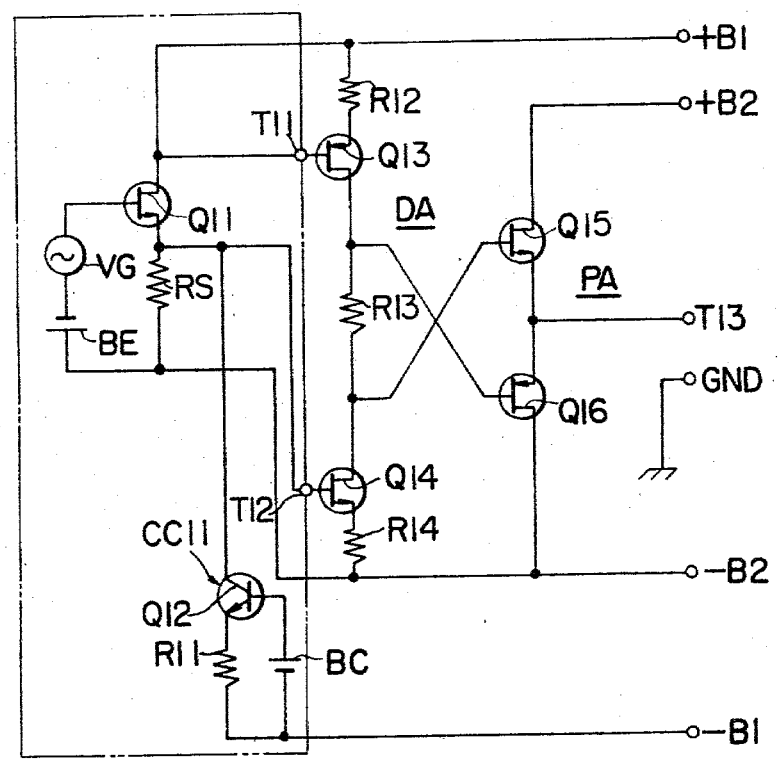
FIG. 11 shows a power amplifier circuit employing a source follower circuit in accordance with this invention.

FIG. 11 shows a power amplifier circuit employing a source folower circuit in pre-driver stage and complimentary symmetrical circuits in driver and power stage. In the figure, a source follower circuit enclosed by a dot-and-dash line is the circuit according to the present invention. In the circuit, terminals T11 and T12 derived from a drain and a source electrode of field effect transistor Q11 are connected respectively to the gates of a p-channel FET Q13 and a n-channel FET Q14 are connected respectively through resistors R12 and R14 to voltage supplies +B1, and −B2. The drain electrodes of transistors Q13 and Q14 are connected each other through resistor R13.

A pair of field effect transistors Q15 and Q16 are connected in series between voltage supplies +B1 and −B2. The gate of transistor Q15 is connected to the point where the drain of transistor Q14 is connected with resistor R13. The gate of transistor Q16 is connected to the point where the drain of transistor Q13 is connected with resistor R13. Output terminal T13 is connected to the junction point of the source electrodes of transistors Q15 and Q16. Thus, said source follower circuit, driver circuit DA, and power amplifier PA are directly connected in cascade.

As described above, in this source follower circuit configuration, a field effect transistor has a source resistor, and the source electrode of the transistor is connected through a constant-current supplying circuit to a negative voltage supply. Therefore, the field effect transistor can be fed a stabilized bias voltage. As the output of this source follower circuit is capable of being connected directly to a gate electrode of an n-channel FET, coupling circuit and voltage supply are simplified.

I claim:
1. An amplifier circuit comprising:
a first and a second field effect transistor each having source and drain electrodes,
a connection between the source electrode of said first transistor and the drain electrode of said second transistor,
an output terminal taken out of said connection,
input terminals connected to the gates of said transistors,
a first resistor connected between gate and one of said electrodes of said first transistor,
a second resistor connected between gate and one of said electrodes of said second transistor,
a first voltage supply connected to the drain of said first transistor,
a second voltage supply connected to the source electrode of said second transistor, and
a constant current supplying means including a pair of output adjustable constant current supplying units,
each unit having a respective further transistor with a collector electrode connected directly to a respective one of said gates, a base electrode, and an emitter electrode,
said constant current supplying means further including a differential balancing potentiometer having an adjustable tap and being connected at opposite ends to said emitters respectively and a manually adjustable third voltage supply connected between said tap on one hand and both of said base electrodes on the other hand for selectively setting manually the operating mode of said first and second field effect transistors by varying the gate biases thereof equally by only adjusting said adjustable third voltage source, the adjustment of said tap being itself operative to balance said gate biases.

2. An amplifier circuit as in claim 1 wherein each of the said further transistors in said constant current supplying means has substantially infinite impedance for alternating current.

3. An amplifier circuit comprising:
a first and a second field effect transistor each having source and drain electrodes,
a connection between the source electrode of said first transistor and the drain electrode of said second transistor,
an output terminal taken out of said connection,
input terminals connected to the gates of said transistors,
a first resistor connected between gate and one of said electrodes of said first transistor,
a second resistor connected between gate and one of said electrodes of said second transistor,
a first voltage supply connected to the drain of said first transistor,
a second voltage supply connected to the source electrode of said second transistor, and
constant-current supplying means having two output terminals connected respectively to the gates of said transistors and comprising:
a differential amplifier including
a third and a fourth transistor each having a collector electrode connected to one of said output terminals of said constant-current supplying means, a base electrode, and an emitter electrode, and an output adjustable constant-current supplying unit including
a fifth transistor having a collector electrode connected to said emitters of said third and fourth transistor, an emitter electrode connected through a resistor to a third voltage supply, a base electrode, and a manually adjustable voltage supply to said third voltage supply and base electrode of said fifth transistor for selectively setting manually the operating mode of said first and second field effect transistors by varying the gate biases thereof equally by only adjusting said adjustable voltage source.

4. An amplifier circuit as in claim 1 or 3 wherein adjustment of said manually adjustable voltage supply causes the said operating mode of said first and second transistors to be selectively set for either a class A or class B operation.

5. An amplifier circuit comprising:
a first and a second field effect transistor each having source and drain electrodes,
a connection between the source electrode of said first transistor and the drain electrode of said second transistor,
an output terminal taken out of said connection,
input terminals connected to the gates of said transistors,
a first resistor connected between gate and one of said electrodes of said first transistor,
a second resistor connected between gate and one of said electrodes of said second transistor,
a first voltage supply connected to the drain of said first transistor,
a second voltage supply connected to the source electrode of said second transistor,
constant-current supplying means having two output terminals connected respectively to the gates of said transistors and comprising:
a differential amplifier including
a third and a fourth transistor each having a collector electrode connected to one of said output terminals of said constant-current supplying means, a base electrode, and an emitter electrode, and an output adjustable constant-current supplying unit including
a fifth transistor having a collector electrode connected to said emitters of said third and fourth transistor, an emitter electrode connected through a resistor to a third voltage supply, and a base electrode connected through an output adjustable voltage supply to said third voltage supply, wherein said output adjustable voltage supply is controlled by a supply-voltage fluctuation detecting means comprising:

a sixth transistor having a emitter electrode connected through a fifth resistor to said first voltage supply, a base electrode connected directly to said second voltage supply, and an collector electrode connected through a sixth resistor to said third voltage supply, and said output adjustable voltage supply includes a Zener diode with its anode connected to said third voltage supply, a first diode with its cathode connected to the cathode of said Zener diode and its anode connected through a fourth resistor to the ground, a potentiometer with an end connected to the junction point of said sixth transistor and said sixth resistor, the other end connected to the anode of said first diode, and a sliding tap connected directly to the base electrode of said fifth transistor and through a second diode to the cathode of said Zener diode.

6. An amplifier circuit comprising:
a first and a second field effect transistor each having source and drain electrodes,
a connection between the source electrode of said first transistor and the drain electrode of said second transistor,
an output terminal taken out of said connection,
input terminals connected to the gates of said transistors,
a first resistor connected between gate and one of said electrodes of said first transistor,
a second resistor connected between gate and one of said electrodes of said second transistor,
a first voltage supply connected to the drain of said first transistor,
a second voltage supply connected to the source electrode of said second transistor,
constant-current supplying means having two output terminals connected to the gates of said transistors and comprising:
a differential amplifier including a third and a fourth transistor each having a collector electrode connected to one of said output terminals of said constant-current supplying means, a base electrode, and an emitter electrode, and
an output adjustable constant-current supplying unit including a fifth transistor having a collector electrode connected to said emitters of said third and fourth transistor, an emitter electrode connected through a resistor to a third voltage supply, and a base electrode connected through an output adjustable voltage supply to said third voltage supply,
wherein said output adjustable voltage supply is controlled by a supply-voltage fluctuation detecting means comprising:
a sixth transistor having an emitter electrode connected through a fifth resistor to ground, a base electrode connected directly to said second voltage supply, and a collector electrode connected through a sixth resistor to said third voltage supply, and
said output adjustable voltage supply includes a Zener diode with its anode connected to said third voltage supply, a first diode with its cathode connected to the cathode of said Zener diode and its anode connected through a fourth resistor to ground, a potentiometer with an end connected to the junction point of said sixth transistor and said sixth resistor, the other end connected to the anode of said first diode, and a sliding tap connected directly to the base electrode of said fifth transistor and through a second diode to the cathode of said Zener diode.

* * * * *